United States Patent

Noma et al.

[11] Patent Number: 5,818,079
[45] Date of Patent: Oct. 6, 1998

[54] SEMICONDUCTOR INTEGRATED CIRCUIT DEVICE HAVING A CERAMIC THIN FILM CAPACITOR

[75] Inventors: Atsushi Noma; Daisuke Ueda, both of Osaka, Japan

[73] Assignee: Matsushita Electronics Corporation, Osaka, Japan

[21] Appl. No.: 664,217

[22] Filed: Jun. 11, 1996

[30] Foreign Application Priority Data

Jun. 13, 1995 [JP] Japan ................................. 7-146263

[51] Int. Cl.⁶ ........................... H01L 21/00; H01L 27/04
[52] U.S. Cl. ...................... 257/295; 257/296; 257/310
[58] Field of Search .................... 257/295, 296, 257/310

[56] References Cited

U.S. PATENT DOCUMENTS

| 5,258,093 | 11/1993 | Maniar | 156/626 |
| 5,406,447 | 4/1995 | Miyazaki | 301/313 |
| 5,572,052 | 11/1996 | Kashihara et al. | 257/295 |

FOREIGN PATENT DOCUMENTS

| 0 441 374 | 8/1991 | European Pat. Off. . |
| 0 557 937 | 9/1993 | European Pat. Off. . |
| 2-232961 | 9/1990 | Japan . |
| 4-356958 | 12/1992 | Japan . |
| 4-360507 | 5/1993 | Japan . |

OTHER PUBLICATIONS

1994 Proceedings. 44th Electronic Components & Technology Conf. (Cat. # 94CH3241–7), Wash. DC, May 1–4, 1994, ISBN 0–7803–0914–6, 1994, N.Y. IEEE, USA, pp. 894–899, XP000479199, D. Dimos et al. "Thin–film decoupling capacitors for multi–chip modules".

Thin Solid Films, vol. 259, No. 2, Apr. 15, 1995, Lausanne CH, pp. 264–269.

IEEE International Solid State Circuits Conf., vol. 36, Feb. 1993, N.Y., US, pp. 172–173, 285, S. Nagata et al., "A GaAs MMIC chip–set for mobile communications using on–chip ferroelectrics capacitors".

Primary Examiner—Valencia Wallace
Attorney, Agent, or Firm—McDermott, Will & Emery

[57] ABSTRACT

A ferroelectric capacitor comprising a lower electrode, a ceramic capacity film made of a ferroelectric substance and an upper electrode is provided on a substrate insulating film formed on a semiconductor substrate. A layer insulating film is formed on the semiconductor substrate so as to cover the ferroelectric capacitor. An electrode wiring is formed on the layer insulating film. A length L of the surface of the ceramic capacity film which is present between an intersection of the side of the upper electrode and the upper face of the ceramic capacity film and an intersection of the side of the ceramic capacity film and the upper face of the lower electrode and a thickness D of the ceramic capacity film have a relationship of L≧2D.

4 Claims, 11 Drawing Sheets

SEMICONDUCTOR INTEGRATED CIRCUIT DEVICE HAVING A CERAMIC THIN FILM CAPACITOR

BACKGROUND OF THE INVENTION

The present invention relates to a semiconductor integrated circuit device and a method for manufacturing the same, and more particularly to the improvement of the structure of capacitors of a semiconductor integrated circuit device, in which the capacitor using a ceramic thin film having a perovskite structure that has been well-known as a material having a very high dielectric constant are integrated on a semiconductor substrate together with a transistor and a resister.

The high-speed processing of bulk data has been required with the advancement of information communication field. In order to meet the requirements, high integration of a semiconductor integrated circuit such as a semiconductor memory has been developed. In addition, a chip area and the number of parts have been reduced by the high integration in order to get small-sized information communication equipment and to lower the cost.

Under the circumstances, the technology for forming a capacitor on a semiconductor integrated circuit by using a ceramic material having the perovskite structure (for example, barium strontium titanate, lead titanate and the like) has been studied actively. In general, the capacity insulating film made of a ceramic thin film which is formed of the above-mentioned ceramic material has a high dielectric constant which is several-ten to several-hundred times as much as that of a capacity insulating film made of a silicon oxide film or a silicon nitride film which is formed in an integrated circuit device according to the prior art.

By using the capacity insulating film made of the ceramic thin film to form the capacitor, the area occupied by the capacitor in the semiconductor integrated circuit device can be reduced to several tenth to several hundredth as compared with the prior art. Consequently, the high integration of the semiconductor integrated circuit device can be realized.

If a capacity insulating film is formed by using a ferroelectric ceramic (hereinafter referred to as a ferroelectric substance) having the properties in which a spontaneous polarization remains even if an applied electric field is removed, it is possible to implement a nonvolatile memory in which stored contents are not eliminated even if a power is turned off.

A semiconductor integrated circuit device and a method for manufacturing the semiconductor integrated circuit device according to the prior art will be described below with reference to the drawings.

Figure 11:
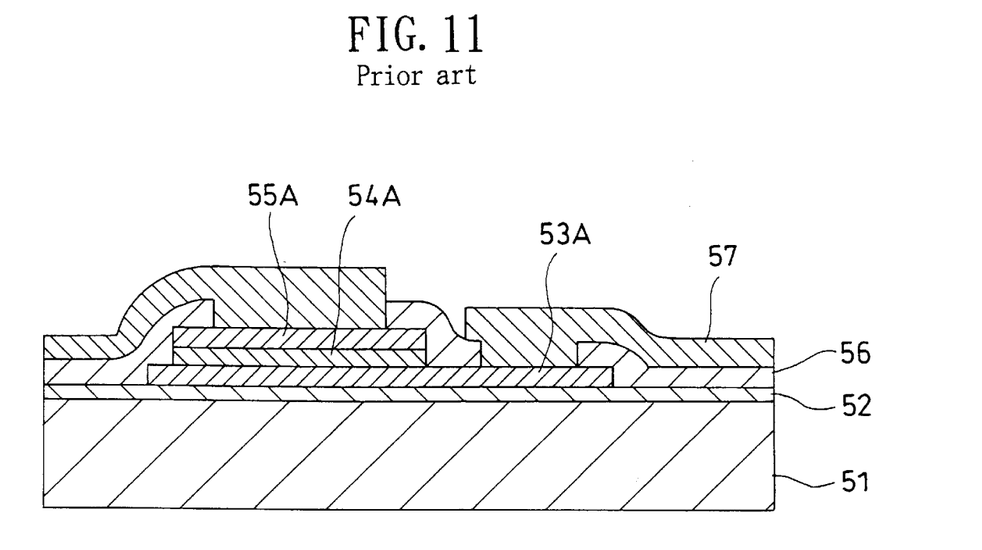
FIG. 11 is a sectional view showing the semiconductor integrated circuit device according to the prior art.

FIG. 11 shows the sectional structure of the semiconductor integrated circuit device according to the prior art. As shown in FIG. 11, a substrate insulating film 52 of a capacitor made of a silicon oxide film is formed on a semiconductor substrate 51. A capacitor comprising a lower electrode 53A made of platinum, a capacity insulating film 54A made of a ceramic thin film which has a perovskite structure, and an upper electrode 55A made of platinum is provided on the substrate insulating film 52. In addition, a layer insulating film 56 made of a silicon oxide film is formed on the semiconductor substrate 51 so as to cover the capacitor. An electrode wiring 57 is formed on the layer insulating film 56. The lower electrode 53A, the upper electrode 55A and the electrode wiring 57 are connected through an opening formed on the layer insulating film 56.

The method for manufacturing the semiconductor integrated circuit device according to the prior art will be described below with reference to FIG. 12.

Figure 12A:
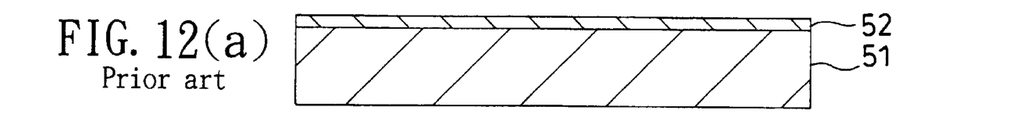
FIGS. 12(a) to 12(f) are sectional views showing each step of a method for manufacturing the semiconductor integrated circuit device according to the prior art.
Figure 12B:
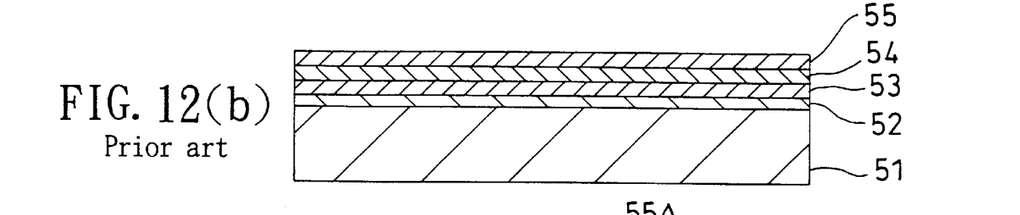

As shown in FIG. 12(a), the substrate insulating film 52 of the capacitor is deposited on the semiconductor substrate 51. Then, a first metal layer 53 as the lower electrode of the capacitor, a ceramic thin film 54 as the capacity insulating film having the perovskite structure, and a second metal layer 55 as the upper electrode of the capacitor are sequentially formed on the substrate insulating film 52 as shown in FIG. 12(b).

Figure 12C:
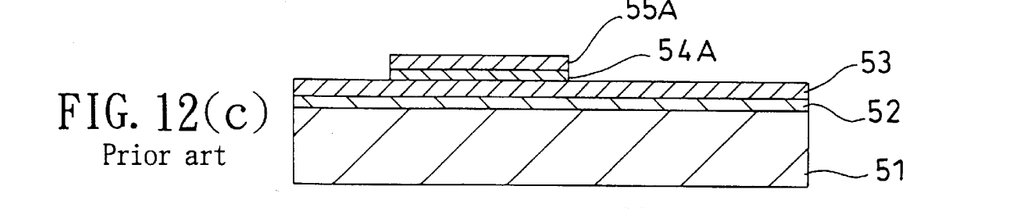
Figure 12D:
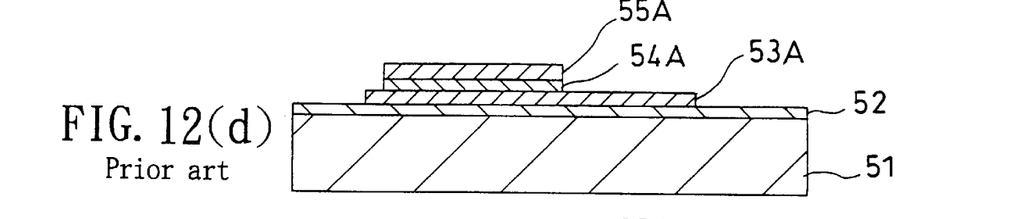

As shown in FIG. 12(c), the second metal layer 55 and the ceramic thin film 54 are etched by the RIE method or the ion milling method using a photoresist mask. Thus, the upper electrode 55A and the capacity insulating film 54A are formed. In the same way, the first metal layer 53 is etched to form the lower electrode 53A as shown in FIG. 12(d).

Figure 12E:
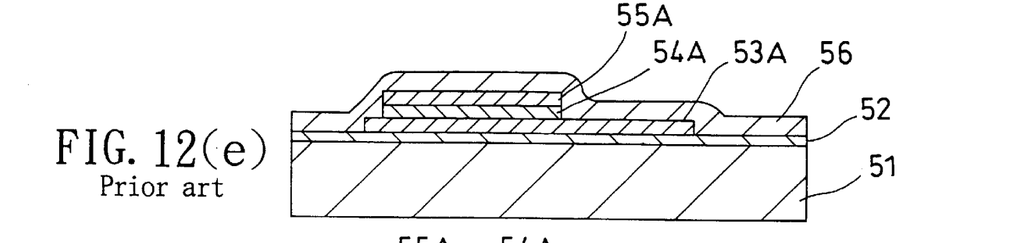
Figure 12F:
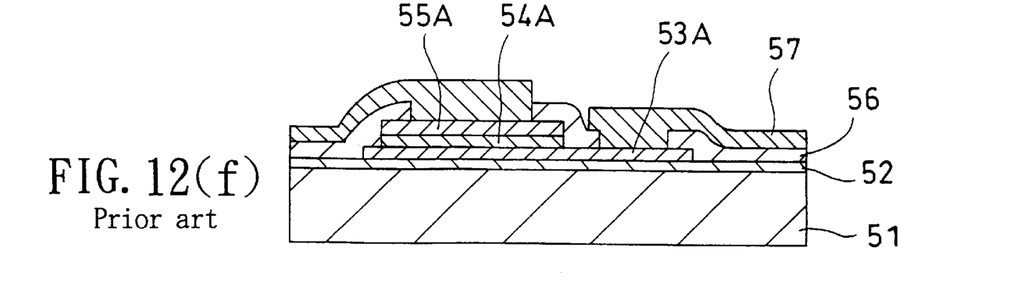

As shown in FIG. 12(e), the layer insulating film 56 is deposited and the opening is then formed in the predetermined area of the layer insulating film 56. Thereafter, the electrode wiring 57 is formed on the layer insulating film 56 as shown in FIG. 12(f). Thus, the capacitor comprising the lower electrode 53A, the capacity insulating film 54A and the upper electrode 55A is finished.

With the above-mentioned structure, the capacitor comprising the upper electrode 55A, the capacity insulating film 54A and the lower electrode 53A is formed by etching using the ion milling method, the RIE method or the like. In this case, the second metal layer 55 and the ceramic thin film 54 are consecutively etched by using the same mask. Consequently, the peripheral end portion of the upper electrode 55A is placed on the same position as that of the capacity insulating film 54A.

In order for a leak current to flow when a voltage is applied to the capacitor, first and second paths are provided. The first path passes through crystal particles forming the capacity insulating film 54A and the grain boundary thereof. The second path passes through the peripheral end portion (side) of the capacity insulating film 54A. The breakdown voltage of the capacitor is determined by the path through which the larger leak current flows.

A crystal structure is disturbed on the side of the capacity insulating film 54A during etching. In addition, in the case where a silicon oxide film or a silicon nitride film is used as the layer insulating film 56, it is directly exposed to a reducing atmosphere such as a silane gas or a hydrogen gas during deposition, and is subjected to reducing reaction to get oxygen defect. Consequently, the leak current flows very easily.

In the capacitor having the above-mentioned structure according to the prior art, the peripheral end portion of the upper electrode 55A is placed on the same position as that of the capacity insulating film 54A. For this reason, a lot of leak currents flow in the path which passes through the side of the capacity insulating film 54A. In addition, the breakdown voltage of the capacitor is controlled by the path which passes through the side of the capacity insulating film 54A. Consequently, the breakdown voltage of the capacitor is lowered considerably.

For example, Japanese Unexamined Patent Application No. 2-232961 has proposed that the surfaces of a capacity insulating film and an electrode wiring are coated with SiN so as to enhance reliability. According to such a structure, the formation of a SiN film is indispensable so that it is not always excellent in respect of working properties.

By way of example, Japanese Unexamined Patent Application No. 4-356958 has proposed that a capacity insulating film is formed to cover a lower electrode so that a countermeasure against leak is taken. Since it is necessary to cover the whole lower electrode with the capacity insulating film, such a structure cannot be applied to the case where an electrode wiring is directly formed on the lower electrode.

SUMMARY OF THE INVENTION

In order to solve the above-mentioned problems, it is an object of the present invention to considerably reduce the leak current of the whole capacitor so as to enhance the breakdown voltage of the capacitor by controlling the generation of the leak current through the side of a capacity insulating film made of a ceramic material, and to eliminate the influence of the side of the ceramic capacity film on the breakdown voltage of the capacitor so as to enhance the yield and reliability of a semiconductor integrated circuit device.

In order to accomplish the above-mentioned object of the present invention, there are first and second paths for a leak current that flows when a voltage is applied to the capacitor, the second path which passes through the side of the capacity film being made longer than the first path which passes through crystal particles forming the capacity film or the grain boundary thereof. Consequently, the breakdown voltage of the capacitor is determined by the first path.

The present invention provides a first semiconductor integrated circuit device comprising a semiconductor substrate, and a laminated capacitor including a lower electrode, a ceramic capacity film made of a ceramic thin film having a perovskite structure, and an upper electrode which are sequentially formed on a main face of the semiconductor substrate, wherein the side of the upper electrode is placed on the inside of the side of the ceramic capacity film, and the side of the ceramic capacity film is placed on the inside of the side of the lower electrode, and a length L of the surface of the ceramic capacity film which is present between an intersection of the side of the upper electrode and the upper face of the ceramic capacity film and an intersection of the side of the ceramic capacity film and the upper face of the lower electrode and a thickness D of the ceramic capacity film have a relationship of $L \geq 2D$.

According to the first semiconductor integrated circuit device, the length L of the surface of the ceramic capacity film which is present between the intersection of the side of the upper electrode and the upper face of the ceramic capacity film and the intersection of the side of the ceramic capacity film and the upper face of the lower electrode and the thickness D of the ceramic capacity film have the relationship of $L \geq 2D$. Consequently, the length of an area which is provided between the side of the upper electrode on the surface of the ceramic capacity film and the side of the ceramic capacity film is greater than the thickness of the ceramic capacity film. Therefore, a path for a current which flows through the surface and side of the ceramic capacity film is longer than a path for the current which flows through the inner portion of the ceramic capacity film.

Accordingly, the breakdown voltage of the capacitor is determined by the leak current which flows through the inner portion of the ceramic capacity film. Thus, the influence of the side wall portion of the ceramic capacity film on the breakdown voltage of the capacitor can be eliminated.

The present invention provides a second semiconductor integrated circuit device comprising a semiconductor substrate, and a laminated capacitor including a lower electrode, a ceramic capacity film made of a ceramic thin film having a perovskite structure, and an upper electrode which are sequentially formed on a main face of the semiconductor substrate, wherein the side of the upper electrode is placed on the inside of the side of the ceramic capacity film, and the side of the ceramic capacity film is placed on the inside of the side of the lower electrode in a part of the peripheral portion of the laminated capacitor, and a length L1 of the surface of the ceramic capacity film which is present between an intersection of the side of the upper electrode and the upper face of the ceramic capacity film and an intersection of the side of the ceramic capacity film and the upper face of the lower electrode and a thickness D of the ceramic capacity film have a relationship of $L1 \geq 2D$, and wherein the side of the upper electrode is placed in the same position as or on the inside of the side of the ceramic capacity film, and the peripheral portion of the ceramic capacity film is provided on the main face of the semiconductor substrate on the outside of the side of the lower electrode in the residual area of the peripheral portion of the laminated capacitor, and a length L2 of the surface of the ceramic capacity film which is present between an intersection of the side of the ceramic capacity film and the main face of the semiconductor substrate and an intersection of the side of the lower electrode and the main face of the semiconductor substrate and the thickness D of the ceramic capacity film have a relationship of $L2 \geq D$.

According to the second semiconductor integrated circuit device, the length of an area which is provided between the side of the upper electrode on the surface of the ceramic capacity film and the side of the ceramic capacity film is greater than the thickness of the ceramic capacity film in the same manner as in the first semiconductor integrated circuit device in the part of the peripheral portion of the laminated capacitor. In addition, the length L2 of the surface of the ceramic capacity film which is present between the intersection of the side of the ceramic capacity film and the main face of the semiconductor substrate and the intersection of the side of the lower electrode and the main face of the semiconductor substrate and the thickness D of the ceramic capacity film have the relationship of $L2 \geq D$ in the residual area of the peripheral portion of the laminated capacitor. Consequently, the length of an area which is provided between the side of the ceramic capacity film on the lower face of the ceramic capacity film and the side of the lower electrode is greater than the thickness of the ceramic capacity film.

Accordingly, a path for a current which flows through the surface and side of the ceramic capacity film is longer than a path for the current which flows through the inner portion of the ceramic capacity film in all the areas of the peripheral portion of the laminated capacitor.

According to the first or second semiconductor integrated circuit device, the breakdown voltage of the capacitor is greatly enhanced. Consequently, the yield and reliability of the semiconductor integrated circuit device can be enhanced considerably.

In the first or second semiconductor integrated circuit device, it is preferable that the surface of the ceramic capacity film which is present between the intersection of the side of the upper electrode and the upper face of the ceramic capacity film and the intersection of the side of the ceramic capacity film and the upper face of the lower electrode should include a first area which is provided between the side of the upper electrode on the surface of the ceramic capacity film and the side of the ceramic capacity film and a second area formed by the side of the ceramic capacity film.

Thus, the length of the area which is provided between the side of the upper electrode on the surface of the ceramic capacity film and the side of the ceramic capacity film is surely greater than the thickness of the ceramic capacity film. Consequently, the path for the current which flows through the surface and side of the ceramic capacity film is surely longer than the path for the current which flows through the inner portion of the ceramic capacity film.

The present invention provides a first method for manufacturing a semiconductor integrated circuit device, comprising the steps of depositing a first metal film on a main face of a semiconductor substrate, patterning the first metal film to form a lower electrode, depositing a ceramic thin film having a perovskite structure on the lower electrode, patterning the ceramic thin film to form a ceramic capacity film such that the side of the ceramic thin film is placed on the inside of the side of the lower electrode, depositing a second metal film on the ceramic capacity film, and patterning the second metal film to form an upper electrode such that the side of the second metal film is placed on the inside of the side of the ceramic capacity film and a length L of the surface of the ceramic capacity film which is present between an intersection of the side of the second metal film and the upper face of the ceramic capacity film and an intersection of the side of the ceramic capacity film and the upper face of the lower electrode and a thickness D of the ceramic capacity film have a relationship of $L \geq 2D$.

According to the first method for manufacturing a semiconductor integrated circuit device, the second metal film is patterned to form the upper electrode such that the length L of the surface of the ceramic capacity film which is present between the intersection of the side of the second metal film and the upper face of the ceramic capacity film and the intersection of the side of the ceramic capacity film and the upper face of the lower electrode and the thickness D of the ceramic capacity film have the relationship of $L \geq 2D$. Consequently, the length L of the surface of the ceramic capacity film which is present between an intersection of the side of the upper electrode and the upper face of the ceramic capacity film and the intersection of the side of the ceramic capacity film and the upper face of the lower electrode and the thickness D of the ceramic capacity film have a relationship of $L \geq 2D$. Accordingly, the first semiconductor integrated circuit device can be manufactured surely.

The present invention provides a second method for manufacturing a semiconductor integrated circuit device, comprising the steps of depositing a first metal film on a main face of a semiconductor substrate, patterning the first metal film to form a lower electrode, depositing a ceramic thin film having a perovskite structure on the lower electrode, patterning the ceramic thin film to form a ceramic capacity film such that the side of the ceramic thin film is placed on the inside of the side of the lower electrode in a part of the peripheral portion of the ceramic thin film, the peripheral portion of the ceramic thin film remains on the semiconductor substrate in the residual area of the peripheral portion of the ceramic thin film, and a length L2 of the surface of the ceramic thin film which is present between an intersection of the side of the ceramic thin film and the main face of the semiconductor substrate and an intersection of the side of the lower electrode and the main face of the semiconductor substrate and a thickness D of the ceramic capacity film have a relationship of $L2 \geq D$, depositing a second metal film on the ceramic capacity film, and patterning the second metal film to form an upper electrode such that the side of the second metal film is placed on the inside of the side of the ceramic capacity film, the side of the second metal film is placed on the inside of the side of the ceramic capacity film in a part of the peripheral portion of the ceramic thin film, and a length L1 of the surface of the ceramic capacity film which is present between an intersection of the side of the second metal film and the upper face of the ceramic capacity film and an intersection of the side of the ceramic capacity film and the upper face of the lower electrode and a thickness D of the ceramic capacity film have a relationship of $L1 \geq 2D$.

The second method for manufacturing a semiconductor integrated circuit device comprises the steps of patterning the ceramic thin film to form the ceramic capacity film such that the length L2 of the surface of the ceramic thin film which is present between the intersection of the side of the ceramic thin film and the main face of the semiconductor substrate and the intersection of the side of the lower electrode and the main face of the semiconductor substrate and the thickness D of the ceramic capacity film have the relationship of $L2 \geq D$ in the residual area of the peripheral portion of the ceramic thin film, and patterning the second metal film to form the upper electrode such that the length L1 of the surface of the ceramic capacity film which is present between the intersection of the side of the second metal film and the upper face of the ceramic capacity film and the intersection of the side of the ceramic capacity film and the upper face of the lower electrode and the thickness D of the ceramic capacity film have the relationship of $L1 \geq 2D$ in the part of the peripheral portion of the ceramic thin film. Therefore, the length L1 of the surface of the ceramic capacity film which is present between the intersection of the side of the upper electrode and the upper face of the ceramic capacity film and the intersection of the side of the ceramic capacity film and the upper face of the lower electrode and the thickness D of the ceramic capacity film have the relationship of $L1 \geq 2D$ in the part of the peripheral portion of the laminated capacitor, and the length L2 of the surface of the ceramic capacity film which is present between the intersection of the side of the ceramic capacity film and the main face of the semiconductor substrate and the intersection of the side of the lower electrode and the main face of the semiconductor substrate and the thickness D of the ceramic capacity film have the relationship of $L2 \geq D$ in the residual area of the peripheral portion of the laminated capacitor. Consequently, the second semiconductor integrated circuit device can be manufactured surely.

The present invention provides a third method for manufacturing a semiconductor integrated circuit device, comprising the steps of sequentially depositing a first metal film, a ceramic thin film and a second metal film on a semiconductor substrate, patterning the second metal film to form an upper electrode such that a lower electrode leading area of the ceramic thin film is exposed, patterning the ceramic thin film and the first metal film at the same time to form a ceramic capacity film and a lower electrode, depositing an insulating film over the whole face of the semiconductor substrate, and etching the insulating film and the ceramic capacity film to form an opening for leading the upper electrode on the insulating film and an opening for leading the lower electrode on the insulating film and the ceramic capacity film.

According to the third method for manufacturing a semiconductor integrated circuit device, the second metal film is patterned to form the upper electrode such that the lower electrode leading area of the ceramic thin film is exposed. Then, the ceramic thin film and the first metal film are patterned at the same time to form the ceramic capacity film and the lower electrode. Consequently, the ceramic thin film and the first metal film can be formed by one-time patterning. For this reason, if the third method for manufacturing a semiconductor integrated circuit device is applied to the first method for manufacturing a semiconductor integrated circuit device, a semiconductor integrated circuit in which the breakdown voltage of the capacitor is greatly enhanced can be manufactured surely without increasing the number of steps.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 9(a) to 9(d) are sectional views showing each step of a third method for manufacturing a semiconductor integrated circuit device according to the present invention;

DETAILED DESCRIPTION OF THE INVENTION

A semiconductor integrated circuit device and a method for manufacturing the semiconductor integrated circuit device according to a first example of the present invention will be described below with reference to the drawings.

Figure 1:
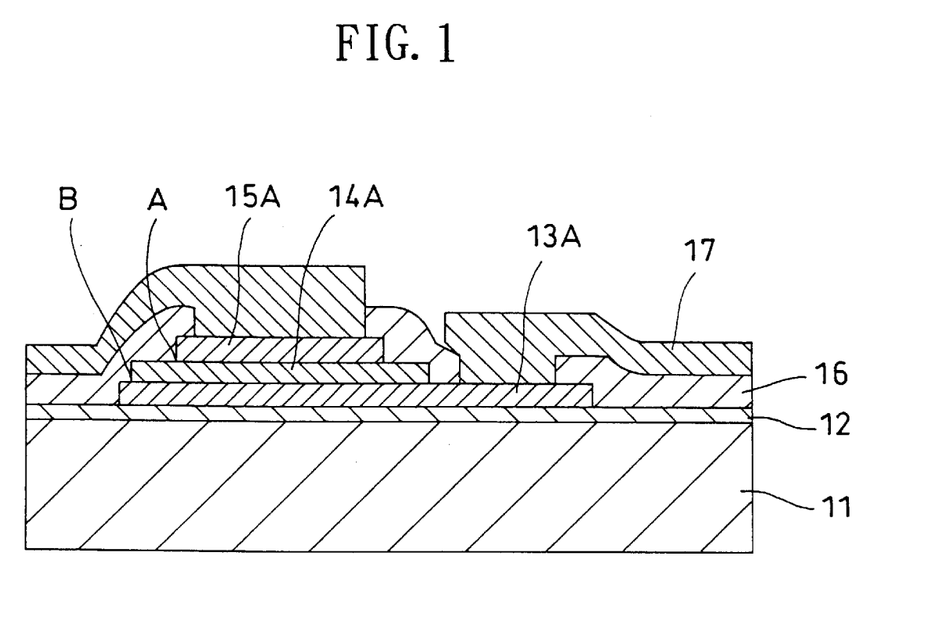
FIG. 1 is a sectional view showing a semiconductor integrated circuit device according to a first example of the present invention.

FIG. 1 is a sectional view showing the structure of a capacitor of the semiconductor integrated circuit device according to the first example of the present invention. According to the first example, a capacitor having a ceramic capacity or capacitive film made of a ferroelectric thin film is formed on a semiconductor substrate.

A substrate insulating film 12 of the capacitor made of a silicon oxide film is formed on a semiconductor substrate 11 comprising semi-insulating GaAs. A ferroelectric capacitor comprising a lower electrode 13A made of platinum, a ceramic capacity film 14A having a thickness of 0.2 µm which is made of a ferroelectric substance, for example, a barium strontium titanate film (hereinafter referred to as a BST film), and an upper electrode 15A made of platinum is formed on the substrate insulating film 12. A layer insulating film 16 made of a silicon oxide film is formed on the semiconductor substrate 11 so as to cover the ferroelectric capacitor. An electrode wiring 17 is formed on the layer insulating film 16. The lower electrode 13A, the upper electrode 15A and the electrode wiring 17 are connected through an opening formed on the layer insulating film 16.

As a feature of the first example, the surface of the ceramic capacity film 14A which is present between an intersection (A) of the side or side wall of the upper electrode 15A and the upper face of the ceramic capacity film 14A and an intersection (B) of the side or side wall of the ceramic capacity film 14A and the upper face of the lower electrode 13A has a length of 0.7 µm. The side wall of the upper electrode 15A is placed on the inside of the side wall of the ceramic capacity film 14A by 0.5 µm.

A first method for manufacturing a semiconductor integrated circuit device according to the first example will be described below with reference to FIGS. 2 and 3.

Figure 2A:
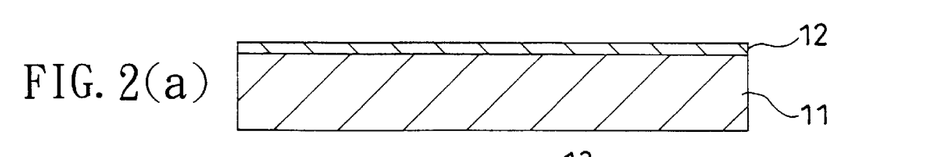
FIGS. 2(a) to 2(d) are sectional views showing each step of a first method for manufacturing the semiconductor integrated circuit device according to the first example of the present invention.
Figure 2B:
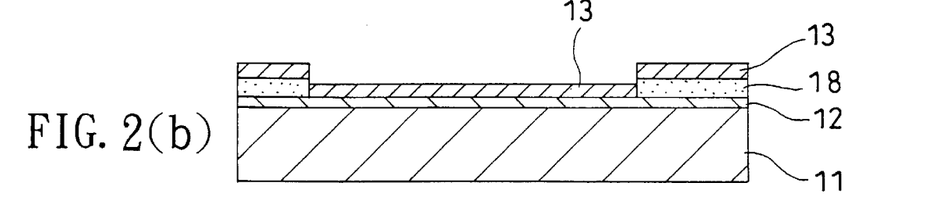

As shown in FIG. 2(a), a substrate insulating film 12 of a capacitor made of a silicon oxide film is formed on a semiconductor substrate 11 comprising GaAs by the CVD method. As shown in FIG. 2(b), a photoresist 18 having an opening in the predetermined area thereof is formed on the substrate insulating film 12, and a first platinum film 13 is deposited over the whole face of the semiconductor substrate 11.

Figure 2C:
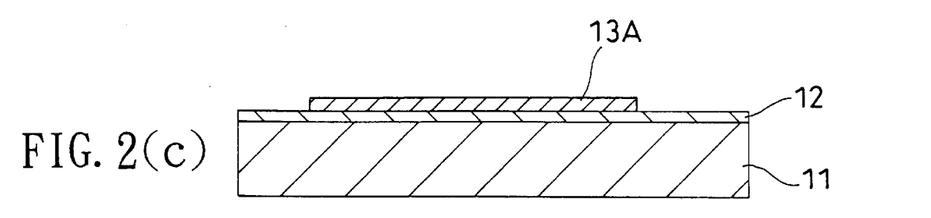
Figure 2D:
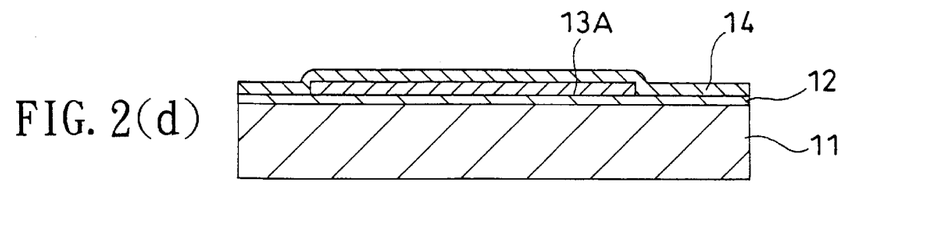

As shown in FIG. 2(c), the first platinum film 13 formed on the photoresist 18 is lifted off by using an organic solvent. Thus, a lower electrode 13A made of platinum is formed. Then, a solution which is obtained by diluting metal alkoxide of barium, strontium and titanium with the organic solvent is spin-coated on the GaAs substrate 11. Thereafter, a treatment is given at a temperature of 700° C. to form a ferroelectric film (hereinafter referred to as a BST film) 14 having a thickness of 0.2 µm as shown in FIG. 2(d).

Figure 3A:
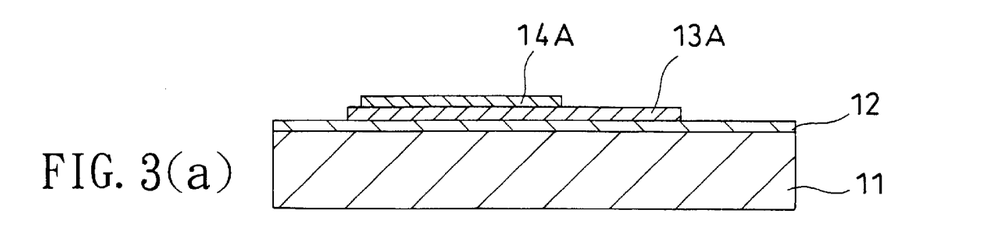
FIGS. 3(a) to 3(d) are sectional views showing each step of the first method for manufacturing the semiconductor integrated circuit device according to the first example of the present invention.
Figure 3B:
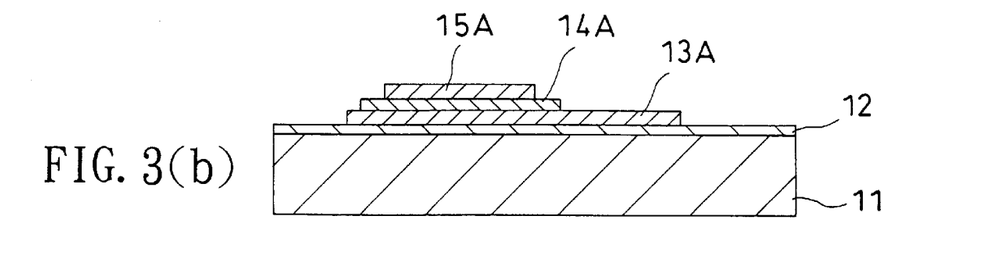

Next, the BST film 14 is etched by using a hydrofluoric acid etching solution to form a ceramic capacity film 14A in an area on the lower electrode 13A which is provided on the inside of the lower electrode 13A as shown in FIG. 3(a). At the same steps as in FIGS. 2(b) and 2(c), a second platinum film (not shown) is formed and then lifted off. As shown in FIG. 3(b), thus, an upper electrode 15A is formed in an area on the ceramic capacity film 14A which is provided on the inside of the ceramic capacity film 14A such that the side of the upper electrode 15A is placed on the inside of the side of the ceramic capacity film 14A by 0.5 µm.

Figure 3C:
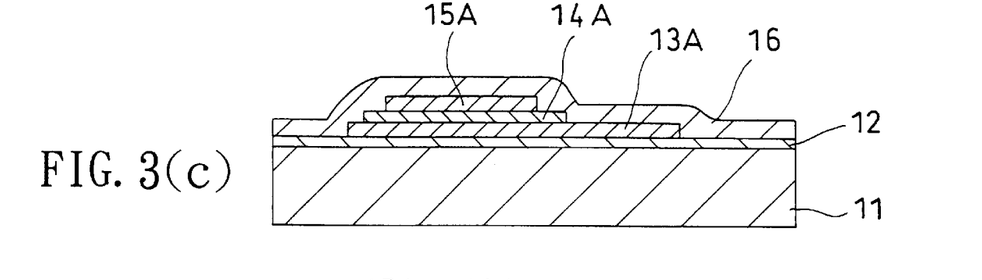
Figure 3D:
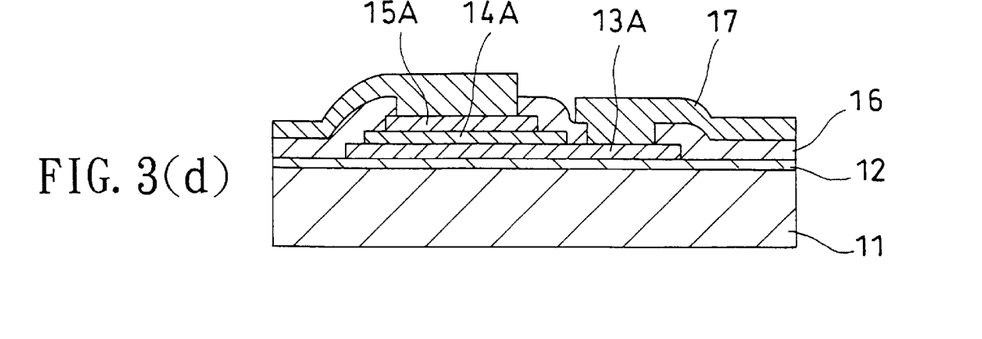

As shown in FIG. 3(c), a layer insulating film 16 made of a silicon oxide film is deposited by the CVD method. Next, an opening is formed in the predetermined area of the layer insulating film 16 and an electrode wiring 17 is then formed on the layer insulating film 16 as shown in FIG. 3(d). If necessary, a protection film made of a silicon nitride film (not shown) is formed on the electrode wiring 17. Thereafter, a bonding pad portion is formed on the protection film.

The action of the capacitor of the semiconductor integrated circuit device according to the first example will be described below with reference to the drawings.

Figure 4:
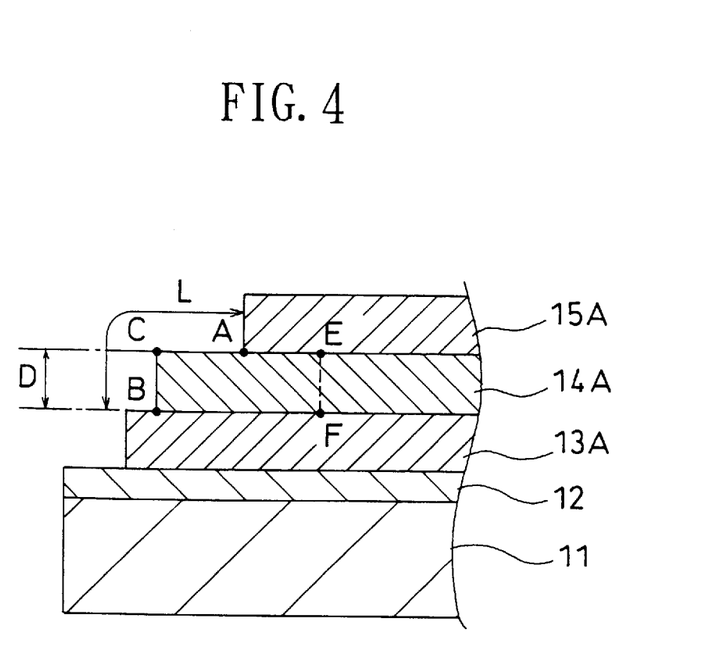
FIG. 4 is a sectional view showing the structure of the peripheral portion of a capacitor of the semiconductor integrated circuit device according to the first example of the present invention.

FIG. 4 is a sectional view showing the structure of the peripheral portion of the capacitor of the semiconductor integrated circuit device according to the first example. In FIG. 4, a length (L) of the surface of the ceramic capacity film 14A which is present between an intersection (A) of the side of the upper electrode 15A and one of main faces of the ceramic capacity film 14A and an intersection (B) of the side of the ceramic capacity film 14A and one of main faces of the lower electrode 13A and a thickness (D) of the ceramic capacity film 14A have a relationship of $L \geq 2D$.

With the structure of the capacitor of the semiconductor integrated circuit device according to the first example, there are two leak current paths of the capacitor, that is, a first path (for example, E - F) which passes through crystal particles of the ceramic capacitor film 14A provided between the upper electrode 15A and the lower electrode 13A and the grain boundary thereof, and a second path (A - C - B) which passes through the surface of the ceramic capacity film 14A provided between the intersection (A) of the side of the upper electrode 15A and one of the main faces of the ceramic capacity film 14A and the intersection (B) of the side of the ceramic capacity film 14A and one of the main faces of the lower electrode 13A. In the second path (A - C - B), a leak current flows very easily on the side (C - B) portion of the ceramic capacity film 14A. Even though the side (C - B) portion is short-circuited, the amount of the leak current which passes through the second path (A - C - B) is not more than that of the leak current which passes through the first path (E - F) because the distance (L) of A - C - B is twice as much as the thickness (D) of the ceramic capacity film 14A or more so that the distance between A and C is equal to or more than the distance between C and B Accordingly, it is possible to eliminate the influence of the side of the ceramic capacity film 14A which causes a lot of leak currents. Consequently, the leak current can be reduced considerably. The breakdown voltage of the capacitor is greatly enhanced because it is determined by the first path (E - F). Thus, the yield and reliability of the semiconductor integrated circuit device can be enhanced.

Figure 5A:
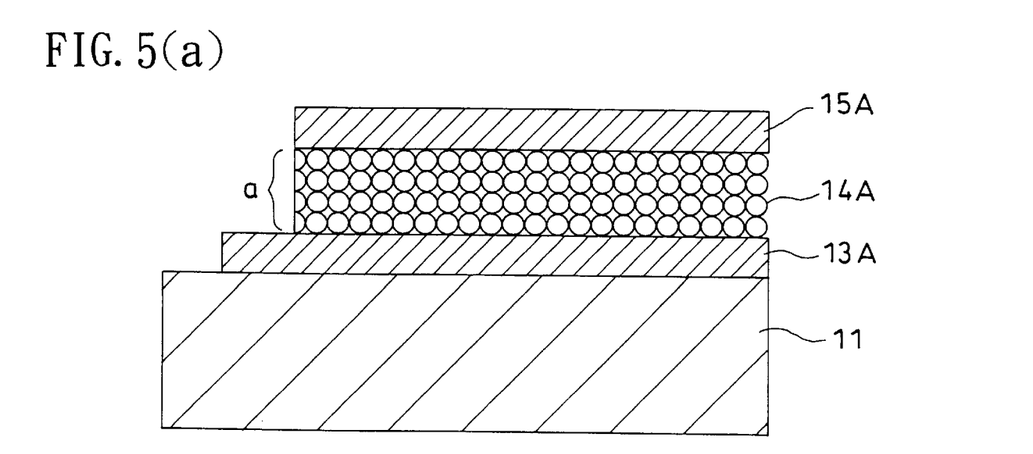
FIGS. 5(a) and 5(b) are views for explaining the action of the capacitors of the semiconductor integrated circuit devices according to the first example of the present invention and the prior art, FIG. 5(a) being a sectional view showing the capacitor of the semiconductor integrated circuit device according to the prior art, and FIG. 5(b) being a sectional view showing the capacitor of the semiconductor integrated circuit device according to the first example of the present invention.
Figure 5B:
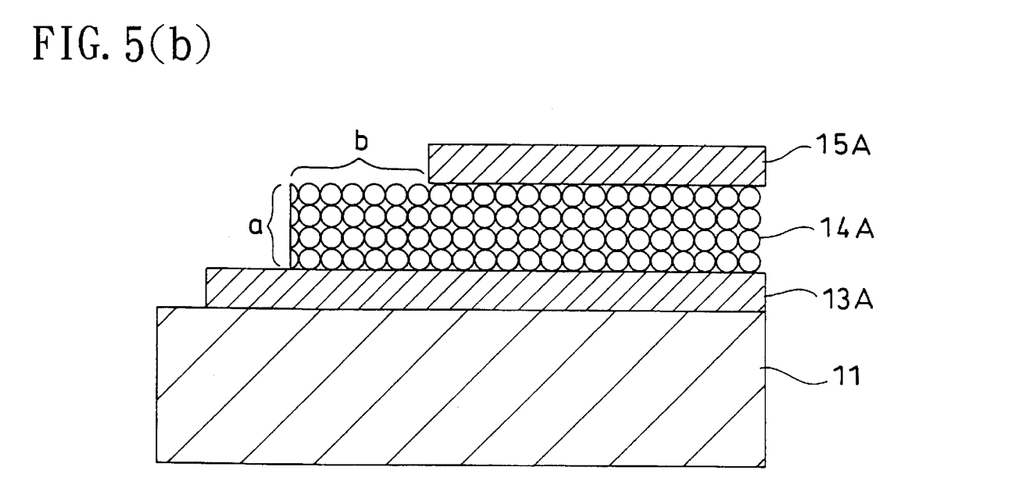

The above-mentioned contents will be conceptionally described with reference to FIGS. 5(a) and 5(b). FIG. 5(a) is a sectional view showing the structure of the capacitor according to the prior art. FIG. 5(b) is a sectional view showing the structure of the capacitor according to the first example. As shown in FIGS. 5(a) and 5(b), a side wall portion (indicated at "a") of the ceramic capacity film 14A has a high defective level because the crystal particles are cut into pieces during etching. Consequently, the leak current flows easily in the side wall portion of the ceramic capacity film 14A. Therefore, the reliability tends to be deteriorated readily. With the structure according to the prior art shown in FIG. 5(a), accordingly, the side of the upper electrode 15A is placed in the same position as the side of the ceramic capacity film 14A. Consequently, a lot of leak currents are easily generated through the side of the ceramic capacity film 14A. With the structure of the first example shown in FIG. 5(b), the side of the upper electrode 15A is placed on the inside of the side of the ceramic capacity film 14A by a distance (indicated at "b") which is equal to or more than the thickness of the ceramic capacity film 14A.

An area (indicated at "b") provided between the side of the upper electrode 15A on the surface of the ceramic capacity film 14A and the side of the lower electrode 13A has perfect crystalline properties. In respect of easy leak current flow, the area "b" can be seen equally to an area provided between the upper electrode 15A in the ceramic capacity film 14A and the lower electrode 13A. Consequently, the influence of the side of the ceramic capacity film 14A on the leak current can be avoided. As a result, the reliability can be enhanced.

Figure 6:
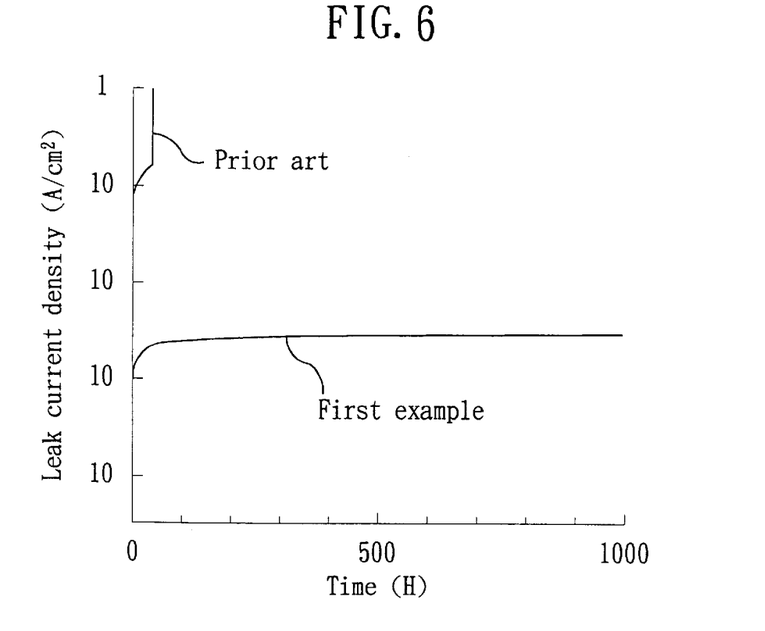
FIG. 6 is a chart showing the relationship between a voltage and a leak current density of the capacitors of the semiconductor integrated circuit devices according to the first example of the present invention and the prior art.

FIG. 6 shows the leak current and breakdown voltage characteristic of the capacitor of the semiconductor integrated circuit device according to the first example. In FIG. 6, the leak current and breakdown voltage characteristic of the capacitor of the semiconductor integrated circuit device according to the prior art is also shown for comparison. As shown in FIG. 6, the leak current is reduced to about one-thousandth in the first example as compared with the prior art.

Figure 7:
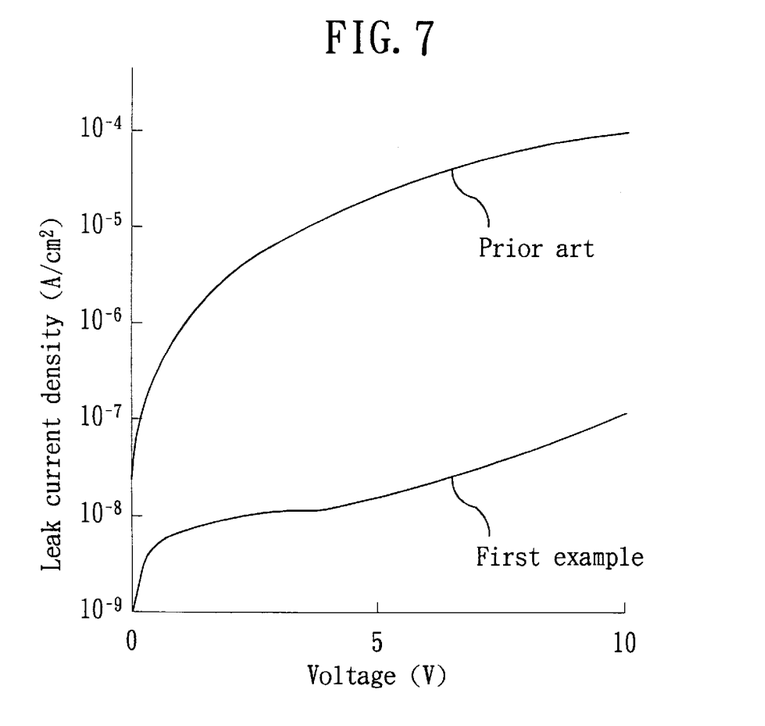
FIG. 7 is a chart showing the relationship between a time and the leak current density of the capacitors of the semiconductor integrated circuit devices according to the first example of the present invention and the prior art.

FIG. 7 shows the change of the leak current (hereinafter referred to as a TDDB characteristic) obtained when a DC voltage of 10 V is continuously applied to the capacitor of the semiconductor integrated circuit device according to the first example at a temperature of 125° C., and the TDDB characteristic of the capacitor of the semiconductor integrated circuit device according to the prior art. The capacitor of the semiconductor integrated circuit device according to the prior art is broken in several-ten hours. On the other hand, the capacitor of the semiconductor integrated circuit device according to the first example operates stably for 1000 hours. Practically, a breakdown voltage of 10 V or more is obtained.

As described above, the length (L) of the surface of the ceramic capacity film 14A which is present between the intersection (A) of the side of the upper electrode 15A and the upper face of the ceramic capacity film 14A and the intersection (B) of the side of the ceramic capacity film 14A and the upper face of the lower electrode 13A and the thickness (D) of the ceramic capacity film 14A have a relationship of $L \geq 2D$. Consequently, the influence of the leak path which passes through the side wall portion of the ceramic capacity film 14A is eliminated. Thus, the breakdown voltage of the capacitor can be enhanced.

According to the first manufacturing method, the lower electrode 13A, the ceramic capacity film 14A and the upper electrode 15A are provided only in the predetermined area to form the capacitor by using the lift off method and the wet etching method. Also in the case where a first platinum film, a ceramic thin film and a second platinum film are sequentially deposited over the whole face of the semiconductor substrate 11 and each layer is then etched sequentially by using the ion milling method and the RIE method to form a capacitor having the same structure as that of the above-mentioned capacitor, it is possible to obtain just the same effects.

In the first manufacturing method, the method for thermally decomposing the metal alkoxide has been used for the deposition of the BST film 14. Also in the case where any other deposition method such as the sputtering method or the MOCVD method is used, it is possible to obtain just the same effects.

When using the method for thermally decomposing the metal alkoxide for the deposition of the BST film 14, pinholes and microcracks are generated on the BST film 14 due to the stress caused by the shrinkage of the film with thermal decomposition so that the breakdown voltage is deteriorated easily. In this case, a second manufacturing method in which the BST film 14 is formed at the following steps is very effective in the enhancement of the breakdown voltage.

The step of forming the BST film 14 in the second manufacturing method will be described below. More specifically, a solution which is obtained by diluting metal alkoxide with an organic solvent is spin-coated. Then, the organic solvent is evaporated to deposit a metal alkoxide film. Thereafter, the metal alkoxide film is etched by using a hydrofluoric acid etching solution. Thus, the metal alkoxide film is left only in a necessary area. Subsequently, a treatment is given at a temperature of 700° C. to form the BST film 14.

According to the second manufacturing method, the metal alkoxide film is formed in a very small area in advance. For this reason, the stress caused by the shrinkage of the metal alkoxide film with thermal decomposition during the high-temperature treatment can be relaxed considerably. Consequently, it is possible to reduce the pinholes and microcracks in the BST film 14 which is formed.

The leak current of the capacitor having the ceramic capacity film 14A which is formed by the second manufacturing method was reduced to one-tenth of the leak current of the capacitor having the ceramic capacity film 14A which is formed by the first manufacturing method. Referring to the TDDB characteristic at a temperature of 125° C. and a voltage of 15V, it was confirmed that the capacitor formed by the first manufacturing method is broken in several-hundred hours, while the capacitor formed by the second manufacturing method operates stably after 1000 hours so that the breakdown voltage is enhanced still more.

The structure of the present invention is indispensable to the enhancement of the breakdown voltage of the capacitor formed by the second manufacturing method. With the structure according to the prior art, the breakdown voltage of the capacitor is determined by the second path which passes through the side wall portion of the ceramic capacity film. Consequently, the effects cannot be obtained even though the pinholes and microcracks in the ceramic capacity film are reduced.

Figure 8:
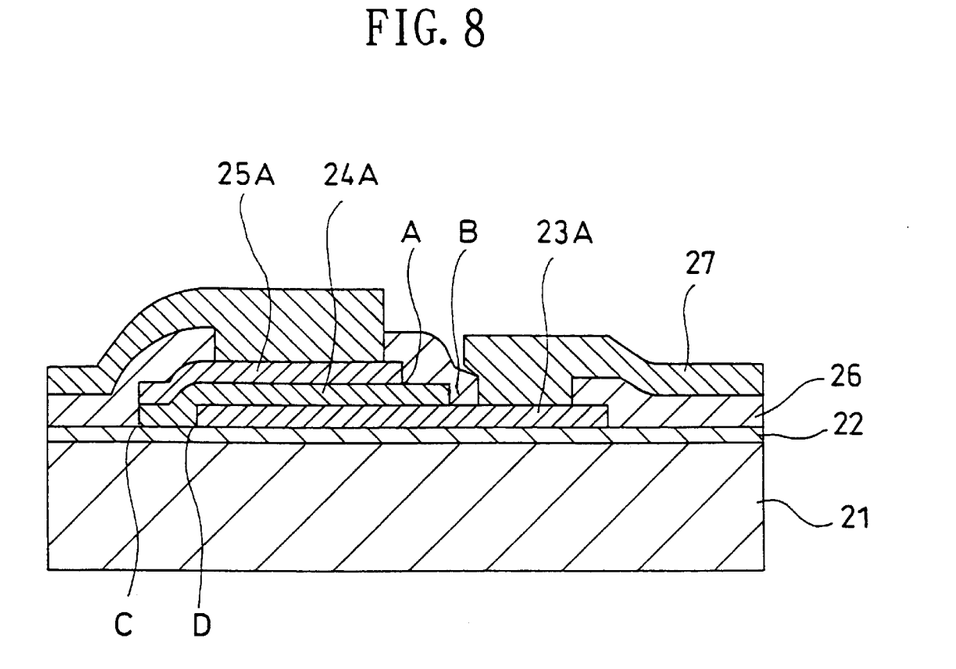
FIG. 8 is a sectional view showing a semiconductor integrated circuit device according to a second example of the present invention.

FIG. 8 is a sectional view showing the structure of a capacitor of a semiconductor integrated circuit device according to a second example of the present invention.

A substrate insulating film 22 of a capacitor which is made of a silicon oxide film is formed on a semiconductor substrate 21 comprising semi-insulating GaAs. A ferroelectric capacitor comprising a lower electrode 23A made of platinum, a ceramic capacity film 24A made of a ferroelectric substance having a thickness of 0.2 μm, and an upper electrode 25A made of platinum is formed on the substrate insulating film 22. A layer insulating film 26 made of a silicon oxide film is formed so as to cover the ferroelectric capacitor. An electrode wiring 27 is formed on the layer insulating film 26. The lower electrode 23A, the upper electrode 25A and the electrode wiring 27 are connected through an opening formed on the layer insulating film 26.

As a feature of the second example, the surface of the ceramic capacity film 24A which is present between an intersection (A) of a side or side wall of the upper electrode 25A and the upper face of the ceramic capacity film 24A and an intersection (B) of a side or side wall of the ceramic capacity film 24A and the upper face of the lower electrode 23A has a length of 0.7 μm in a part of the peripheral portion of the capacitor. On the other hand, the surface of the ceramic capacity film 24A which is present between an intersection (C) of the other side or side wall of the ceramic capacity film 24A and the main face of the semiconductor substrate 21 and an intersection (D) of the other side or side wall of the lower electrode 23A and the main face of the semiconductor substrate 21 has a length of 0.7 μm in the residual area of the peripheral portion of the capacitor.

According to the second example, a length (L1) of the surface of the ceramic capacity film 24A which is present between the intersection (A) of the side of the upper electrode 25A and the upper face of the ceramic capacity film 24A and the intersection (B) of the side of the ceramic capacity film 24A and the upper face of the lower electrode 23A and a thickness (D) of the ceramic capacity film 24A have a relationship of L1≧2D in the part of the peripheral portion of the capacitor in the same manner as in the first example. In addition, the other side or side wall of the upper electrode 25A is placed in the same position as or on the other inside of the side of the ceramic capacity film 24A, and a length (L2) of the surface of the ceramic capacity film 24A which is present between the other intersection (C) of the side of the ceramic capacity film 24A and the main face of the semiconductor substrate 21 and the other intersection (D) of the side of the lower electrode 23A and the main face of the semiconductor substrate 21 and the thickness (D) of the ceramic capacity film 24A have a relationship of L2≧D in the residual area of another part of the peripheral portion of the capacitor.

Also in the second example, the influence of the side wall portion of the ceramic capacity film 24A on the leak current can be avoided in the same manner as in the first example. Consequently, the reliability of the semiconductor integrated circuit device can be enhanced.

In the same manner as in the first example, the semiconductor integrated circuit device according to the second example can be formed by the lift off method and the etching method.

A third method for manufacturing a semiconductor integrated circuit device will be described below with reference to FIGS. 9 and 10.

Figure 9A:
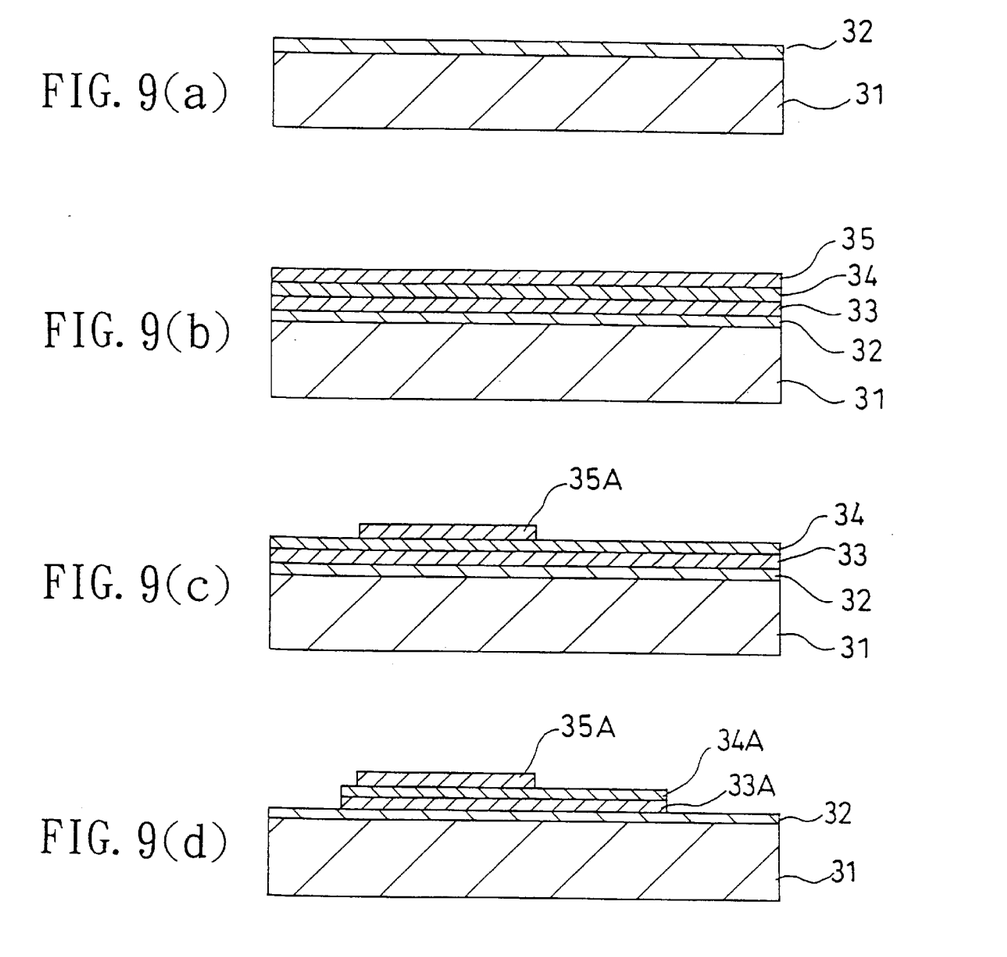

As shown in FIG. 9(a), a substrate insulating film 32 of a capacitor which is made of a silicon oxide film is formed on a semiconductor substrate 31 comprising GaAs by the CVD method, for example. Then, a first platinum film 33, a BST film 34 and a second platinum film 35 are sequentially deposited on the substrate insulating film 32 as shown in FIG. 9(b).

As shown in FIG. 9(c), a photoresist mask is used to etch the second platinum film 35 by the ion milling method or the RIE method. Thus, an upper electrode 35A is formed. As shown in FIG. 9(d), the BST film 34 and the first platinum film 33 are then etched at the same time in the same way. Consequently, a ceramic capacity film 34A and a lower electrode 33A are formed.

Figure 10A:
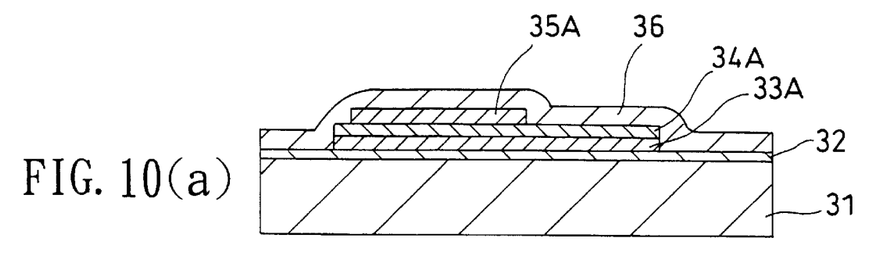
FIGS. 10(a) to 10(c) are sectional views showing each step of the third method for manufacturing a semiconductor integrated circuit device according to the present invention.
Figure 10B:
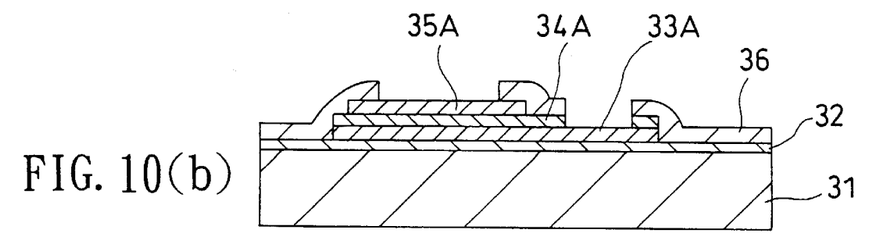
Figure 10C:
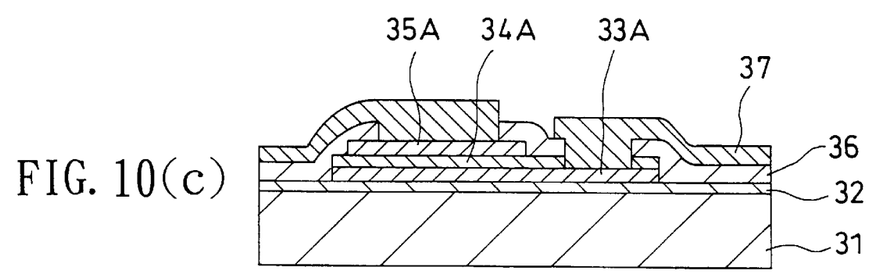

As shown in FIG. 10(a), a layer insulating film 36 made of a silicon oxide film is deposited by the CVD method. As shown in FIG. 10 (b), an opening is then formed by the RIE method or the wet etching method in the predetermined area of the layer insulating film 36, that is, an area to which the upper electrode 35A is exposed and an area to which the lower electrode 33A is exposed at the same time. Thereafter, an electrode wiring 37 is formed on the layer insulating film 36.

According to the first or second manufacturing method described above, the lower electrode, the ceramic capacity film and the upper electrode are individually formed sequentially. Consequently, the number of necessary steps is increased more than in the manufacturing method according to the prior art so that the cost may be increased. According to the third manufacturing method, however, it is possible to obtain the semiconductor integrated circuit device having the same effects as in the first example without increasing the number of the steps necessary for the formation of the capacitor.

While the semi-insulating GaAs substrate has been used as a semiconductor substrate in the first or second example, a silicon substrate may be used instead.

While the BST film which is the ferroelectric substance has been used as a ceramic thin film for the capacity insulating film of the capacitor in the first or second example, the BST film is not always needed but a ceramic thin film having a perovskite structure can be used to obtain the same effects. In other words, the present invention is not related to the presence of a spontaneous polarization which is a feature of a ferroelectric material. In consideration of the fact that the capacitor is exposed to the reducing atmosphere during deposition of the layer insulating film to get oxygen defect so that the leak current flows readily, it can be easily understood that the same effects can be obtained by using strontium titanate having a high dielectric constant and no spontaneous polarization or other general ceramic materials having the perovskite structure.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

We claim:
1. A semiconductor integrated circuit device comprising:
a semiconductor substrate; and
a laminated capacitor including a lower electrode, a ceramic capacitive film made of a ceramic thin film having a perovskite structure, and an upper electrode which are sequentially formed on a main face of said semiconductor substrate;
wherein a sidewall of said upper electrode is placed on an upper face of said ceramic capacitive film inwardly from a sidewall of said ceramic capacitive film, and said sidewall of said ceramic capacitive film is placed on an upper face of said lower electrode inwardly from said sidewall of said lower electrode,
wherein the distance between said sidewall of said upper electrode and said sidewall of said ceramic capacitive film, said distance being measured along a surface of said upper face of said ceramic capacitive film, plus a thickness D of said ceramic capacity film measured along a surface of said sidewall of said ceramic capacitive film, equals a length L, and
wherein said length L and said thickness D of said ceramic capacitive film have a relationship of $L \geq 2D$.

2. The semiconductor integrated circuit device of claim 1,
wherein said surface of said upper face of said ceramic capacitive film forms a first area and said surface of said sidewall of said ceramic capacitive film forms a second area.

3. A semiconductor integrated circuit device comprising:
a semiconductor substrate; and
a laminated capacitor including a lower electrode, a ceramic capacitive film made of a ceramic thin film having a perovskite structure, and an upper electrode which are sequentially formed on a main face of said semiconductor substrate;
wherein a sidewall of said upper electrode is placed on an upper face of said ceramic capacitive film inwardly from a sidewall of said ceramic capacitive film, and said sidewall of said ceramic capacitive film is placed on an upper face of said lower electrode inwardly from said sidewall of said lower electrode in a part of the peripheral portion of said laminated capacitor,
wherein the distance between said sidewall of said upper electrode and said sidewall of said ceramic capacitive film, said distance being measured along a surface of said upper face of said ceramic capacitive film, plus a thickness D of said ceramic capacitive film measured along a surface of said sidewall of said ceramic capacitive film, equals a length L1,
wherein said length L1 and said thickness D of said ceramic capacitive film have a relationship of $L1 \geq 2D$,
wherein another sidewall of said upper electrode is placed on said upper face of said ceramic capacitive film flush with another sidewall of said ceramic capacitive film or inwardly from said another sidewall of said ceramic capacitive film, and another part of said peripheral portion of said ceramic capacitive film is provided on said main face of said semiconductor substrate on the outside of another sidewall of said lower electrode in a residual area of said another part of said peripheral portion of said laminated capacitor,
wherein the distance between said another sidewall of said lower electrode and said another sidewall of said ceramic capacitive film, said distance being measured along said main face of said semiconductor substrate, equals a length L2, and
wherein said length L2 and said thickness D of said ceramic capacitive film have a relationship of $L2 \geq D$.

4. The semiconductor integrated circuit device of claim 3,
wherein said surface of said upper face of said ceramic capacitive film forms a first area and said surface of said sidewall of said ceramic capacitive film forms a second area.

* * * * *